United States Patent
Hanson et al.

(10) Patent No.: US 6,930,046 B2
(45) Date of Patent: Aug. 16, 2005

(54) SINGLE WORKPIECE PROCESSING SYSTEM

(75) Inventors: Kyle M. Hanson, Kalispell, MT (US); Eric Lund, Kent, WA (US); Coby Grove, Whitefish, MT (US); Steven L. Peace, Whitefish, MT (US); Paul Z. Wirth, Columbia Falls, MT (US); Scott A. Bruner, Kalispell, MT (US); Jonathan Kuntz, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 24 days.

(21) Appl. No.: 10/690,864

(22) Filed: Oct. 21, 2003

(65) Prior Publication Data

US 2004/0079403 A1 Apr. 29, 2004

Related U.S. Application Data

(63) Continuation-in-part of application No. 10/202,074, filed on Jul. 23, 2002, now Pat. No. 6,794,291, which is a continuation of application No. 09/437,711, filed on Nov. 10, 1999, now Pat. No. 6,423,642, which is a continuation-in-part of application No. PCT/US99/05676, filed on Mar. 15, 1999.
(60) Provisional application No. 60/116,750, filed on Jan. 22, 1999.

(51) Int. Cl.$^7$ .............................................. H01L 21/311
(52) U.S. Cl. ...................... 438/694; 438/906; 438/907; 438/913; 438/780; 438/782; 134/1.3
(58) Field of Search ...................... 438/694, 906–913, 438/780–782, 758; 134/153–57, 199, 902, 1.3; 118/723

(56) References Cited

U.S. PATENT DOCUMENTS

| | | | |
|---|---|---|---|
| 4,544,446 A | 10/1985 | Cady | |
| 5,613,343 A * | 3/1997 | Inoue et al. | 53/111 R |
| 6,309,520 B1 | 10/2001 | Woodruff et al. | |
| 6,334,937 B1 | 1/2002 | Batz, Jr. et al. | |
| 6,423,642 B1 | 7/2002 | Peace et al. | |
| 6,548,411 B2 * | 4/2003 | Wirth et al. | 438/694 |
| 2002/0017237 A1 * | 2/2002 | Wirth et al. | 118/500 |
| 2002/0168863 A1 * | 11/2002 | Aegerter et al. | 438/718 |
| 2003/0136431 A1 * | 7/2003 | Scranton et al. | 134/63 |
| 2003/0176067 A1 * | 9/2003 | Wirth et al. | 438/689 |
| 2004/0129302 A1 * | 7/2004 | Hanson et al. | 134/137 |

FOREIGN PATENT DOCUMENTS

WO    WO 99/46065    9/1999

* cited by examiner

*Primary Examiner*—David Zarneke
*Assistant Examiner*—Granvill Lee
(74) *Attorney, Agent, or Firm*—Perkins Coie LLP

(57) ABSTRACT

A system and method for processing a workpiece, includes workpiece processors. A robot is moveable within an enclosure to load and unload workpieces into and out of the processors. A processor includes an upper rotor having a central air flow opening. The upper rotor is magnetically driven into engagement with a lower rotor to form a workpiece processing chamber. A moveable drain mechanism aligns different drain paths with the processing chamber so that different processing fluids may be removed from the processing chamber via different drain paths. A moveable nozzle positioned in the air flow opening distributes processing fluid to the workpiece. The processing fluid is distributed across the workpiece surface, via centrifugal force generated by spinning the processing chamber, and removed from the processing chamber via the moveable drain mechanism.

82 Claims, 13 Drawing Sheets

SINGLE WORKPIECE PROCESSING SYSTEM

This Application is a Continuation-In-Part of U.S. patent application Ser. No. 10/202,074, filed Jul. 23, 2002 now U.S. Pat. No. 6,794,291 and now pending, which is a Continuation of U.S. patent application Ser. No. 09/437,711, filed Nov. 10, 1999, now U.S. Pat. No. 6,423,642, which is a Continuation-In-Part and U.S. National Phase of: International Patent Application No. PCT/US99/05676, filed Mar. 15, 1999, published in English and designating the United States, and claiming priority to U.S. patent application Ser. No. 60/116,750 filed Jan. 22, 1999. Priority to these Applications is claimed under 35 U.S.C. 119, 120 and/or 365. These Applications are also incorporated herein by reference.

BACKGROUND OF THE INVENTION

Microelectronic devices are used in a wide array of products. These devices, such as memory and microprocessor chips and similar devices have traditionally been used in, for example, computers, telephones, sound equipment and other electronic products. Over the last several years, microelectronic devices have become faster, better, and less expensive. Microelectronic devices are accordingly now also used in traditionally non-electronic products, such as appliances, vehicles, toys and games, medical devices, novelty items, etc. The remarkable progress made in the microelectronic device industry has led to better yet less expensive products of all types. It has also led to entirely new types of products.

A major factor in the development of microelectronic devices has been the machines and methods used to manufacture them. Manufacturing of microelectronic devices requires extreme precision, extremely pure materials, and an extremely clean manufacturing environment. Even tiny particles of dust, dirt, metals, or manufacturing chemicals, at almost any stage of the manufacturing process, can cause defects and failures in devices. Reducing contaminants is therefore critical to cost effective manufacturing. Accordingly, intensive research and development has focused on reducing contaminants in microelectronic manufacturing processes. As microelectronic devices are made even smaller, reducing contaminants has become even more important, and more difficult to achieve. In the past, various approaches have been used to reduce contaminants. These include use of materials that tend not to generate particles, careful selection and placement of mechanical components in processing machines, and use of a flow of highly filtered and clean air or gases, to carry any particles generated away from the wafers or substrates which form the microelectronic devices. Even though these techniques have been successful, engineering challenges remain in trying to further reduce contamination, to provide more reliable and cost effective manufacturing. As described below, the inventors of this patent application have now designed new machines and methods which offer significantly improved manufacturing of microelectronic devices.

Manufacturing of microelectronic devices involves using various chemicals. These chemicals are typically in liquid form, although gases and vapors are also often used. These chemicals must be highly pure and are therefore expensive. Chemicals used in some processes, such as strong acids or oxidizers, are also toxic. Use and disposal of these chemicals after they are used, can be time consuming and expensive. Consequently, reducing the amount of chemicals used is highly advantageous. On the other hand, in general, enough of the chemicals must be provided so that they can be uniformly applied over all surfaces of the wafer or substrate being processed or manufactured. It can therefore be difficult to minimize chemical consumption, while maintaining good manufacturing results.

Manufacturing microelectronic devices also uses large amounts of purified and de-ionized water. After it is used, e.g., for rinsing, the water typically will have small amounts of dissolved chemicals in it. The water then also often requires special handling and disposal efforts. Accordingly, reducing the amount of water used, as well as the amounts of chemicals used, would be highly advantageous.

Another problem that may occur in existing microelectronic device manufacturing systems is that processing chemicals may be mixed with one another when the chemicals are drained from the processing chamber, and/or when the chemicals are re-circulated back to the processing chamber. When processing chemicals are mixed with one another, disposal of them can be more difficult. Thus, there is a need for a wafer processing system that can effectively isolate different processing chemistries from one another during and after wafer or substrate processing.

Another problem in existing wafer-processing systems arises when a nozzle or other fluid outlet is oriented to spray processing fluid downward onto a wafer. After the fluid delivery is stopped, some excess processing fluid may drip out of the nozzle onto the wafer. At certain times, even a few drops of excess fluid can result in defects or failure of the microelectronic end products. Thus, there is a need for a wafer processing system that overcomes these disadvantages.

SUMMARY OF THE INVENTION

After extensive research and development, the inventors have created a new wafer or substrate processing system, which provides dramatic improvements in manufacturing microelectronic and similar devices. This new system reduces contamination. As a result, there are fewer defects in the end products. This reduces the total amount of raw materials, chemicals, water, time, labor and effort required to manufacture microelectronic devices. Correspondingly, less waste, such as used chemicals and waste water, are created.

This newly created system also greatly reduces the amount of chemicals and water needed in manufacturing. By using chemicals and water in new and more efficient ways, high manufacturing quality standards are achieved, yet with less chemical and water consumption, when compared with existing systems now in use.

One feature of the invention is a new system that includes an upper rotor that is engageable with a lower rotor to form a workpiece processing chamber. The upper rotor has a central air inlet opening. This rotor design provides an air flow path through the processing chamber which tends to avoid having contaminant particles contact the workpiece. This improves the manufacturing yield or efficiency of the system, by reducing defects in the microelectronic or other end products.

Another separate feature of the invention is a fluid applicator or nozzle moveable within the opening for distributing a processing fluid to different portions of the workpiece in the processing chamber. A fluid delivery line leading into the nozzle preferably includes a collection section for collecting processing fluid when fluid delivery to the nozzle is discontinued. This prevents excess processing fluid from dripping onto the workpiece. Consequently, manufacturing is more consistent, and defects are reduced. The nozzle is preferably moveable away from the upper rotor member so that the upper rotor member may be raised to facilitate loading of a workpiece into the processing chamber.

In another separate feature of the invention, the upper rotor is magnetically driven into contact with the lower rotor. A face seal is preferably used to seal the upper rotor against the lower rotor. This improves the reliability of the system and also reduces potential for particle generation in the system.

Another separate feature of the invention is a moveable drain assembly having multiple drain paths. Each drain path is separately alignable with the processing chamber by moving the drain assembly to align a single drain path with the processing chamber. As a result, used liquid process chemical can be separately removed, collected, and either recycled or processed for disposal. Mixing of used liquid process chemicals is avoided. Processing is therefore less complex and less costly.

Other features and advantages of the invention will appear hereinafter. The features of the invention described above can be used separately or together, or in various combinations of one or more of them, with no single feature essential to the invention. The processor and drain assembly can be used alone, or in a system with robotic automation. The processor and drain assembly can each be used separately from each other, or together. The invention resides as well in sub-combinations of the features described.

BRIEF DESCRIPTION OF THE DRAWINGS

In the drawings, wherein the same reference number denotes the same element, throughout the several views.

DETAILED DESCRIPTION OF THE DRAWINGS

The invention is directed to apparatus and methods for processing a workpiece, such as a semiconductor wafer. The term workpiece, wafer, or semiconductor wafer means any flat media or article, including semiconductor wafers and other substrates or wafers, glass, mask, and optical or memory media, MEMS substrates, or any other workpiece having micro-electronic, micro-mechanical, or electro-mechanical devices.

Figure 1:
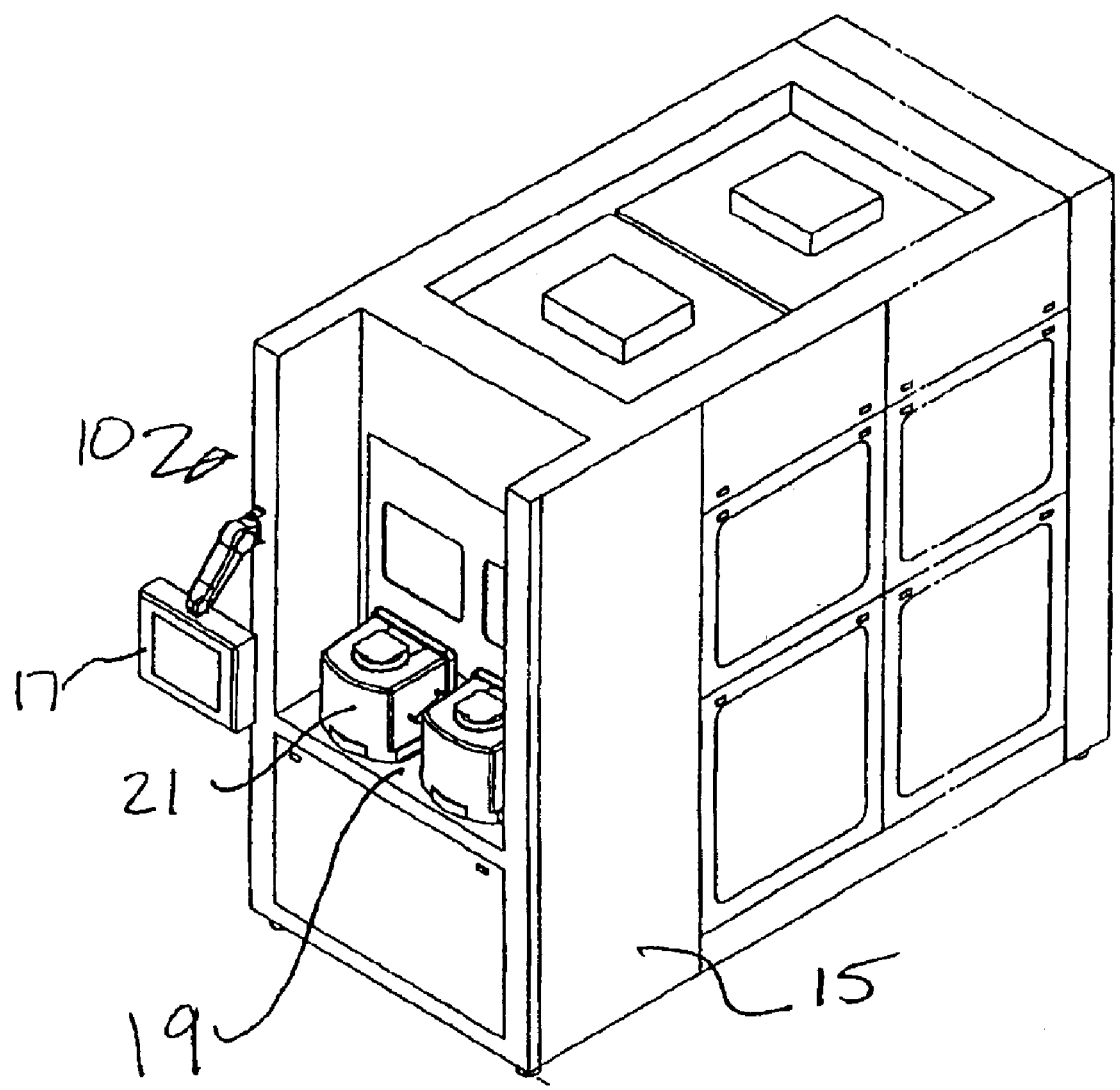
FIG. 1 is a perspective view of a workpiece processing system including a preferred workpiece processor.

As shown in FIG. 1, a processing system 10 has an enclosure 15, a control/display 17, and an input/output station 19. Wafers or workpieces 24 within pods or boxes 21 are removed from the boxes 21 and processed within the system 10.

Figure 2:
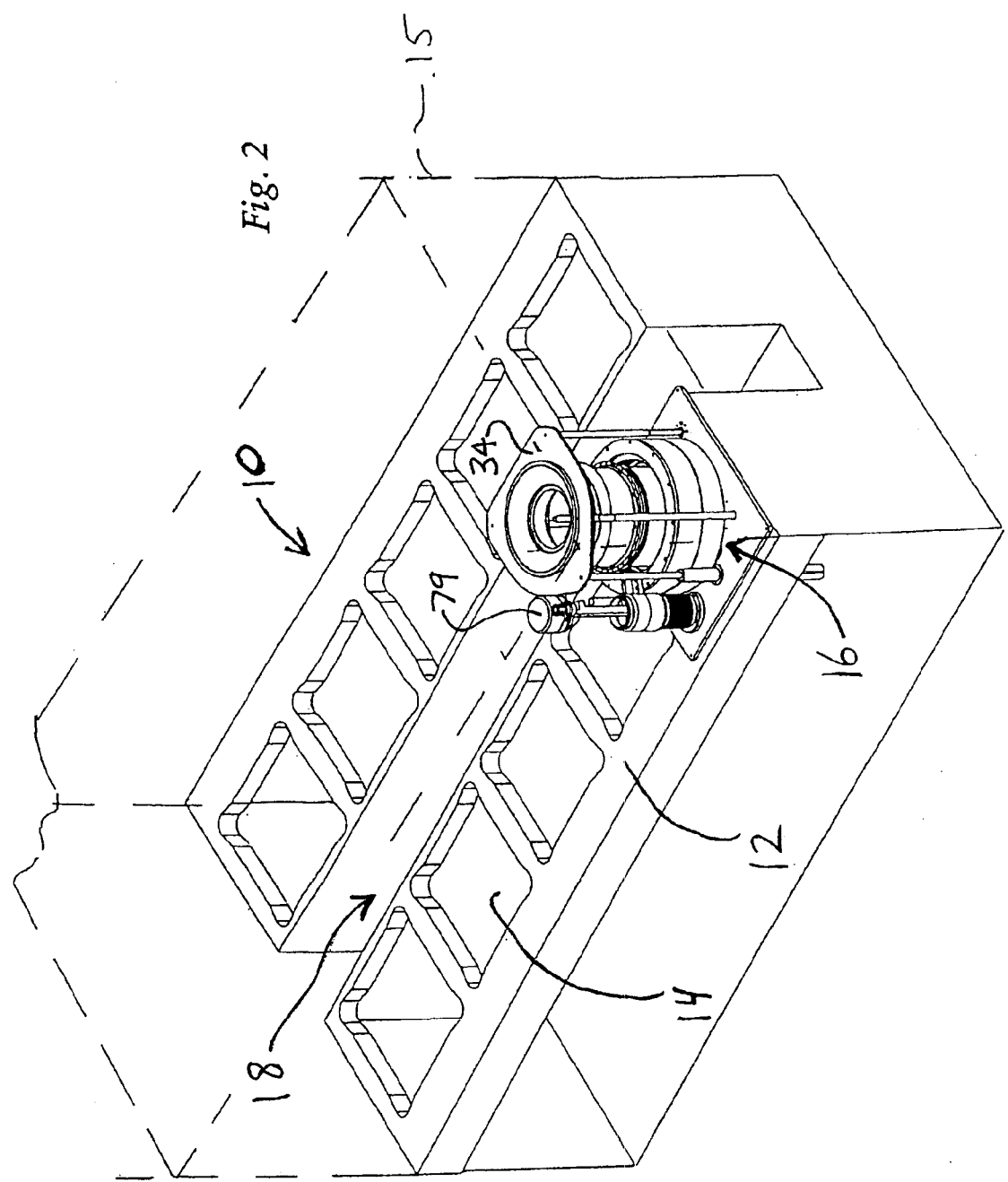
FIG. 2 is a perspective view of the system shown in FIG. 1, with components removed for purpose of illustration.

Turning to FIG. 2, the processing system 10 includes a support structure frame 12 with a plurality of processing stations 14 within the enclosure 15. A workpiece processor 16 is positioned at only one of the processing stations 14 for purpose of illustration. The workpiece processor 16 may be configured to process workpieces, such as 200 or 300 mm diameter semiconductor wafers provided within sealed boxes 21, open cassettes, or other carrier or container.

Figure 3:
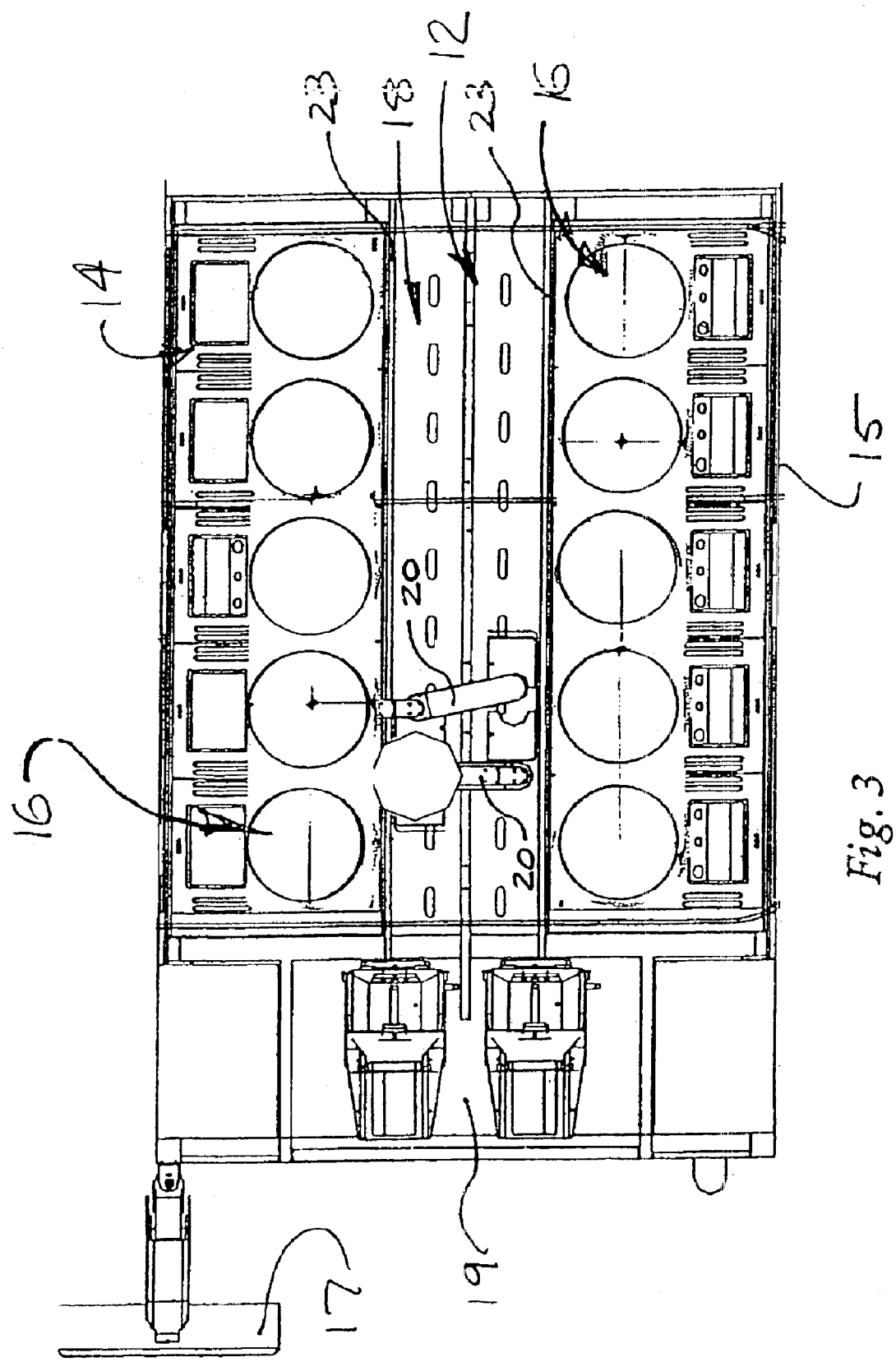
FIG. 3 is a plan view of the system shown in FIG. 1.

Referring to FIG. 3, preferably all of the processing stations 14 in the enclosure 15 have a workpiece processor 16. The frame 12 in FIG. 2 is shown having ten workpiece processing stations 14, but any desired number of processing stations 14 may be included in the enclosure 15. The frame 12 preferably includes a centrally located, longitudinally oriented space 18 between the processing stations 14. One or more robots 20 move to load and unload workpieces into and out of the processors 16.

Figure 4:
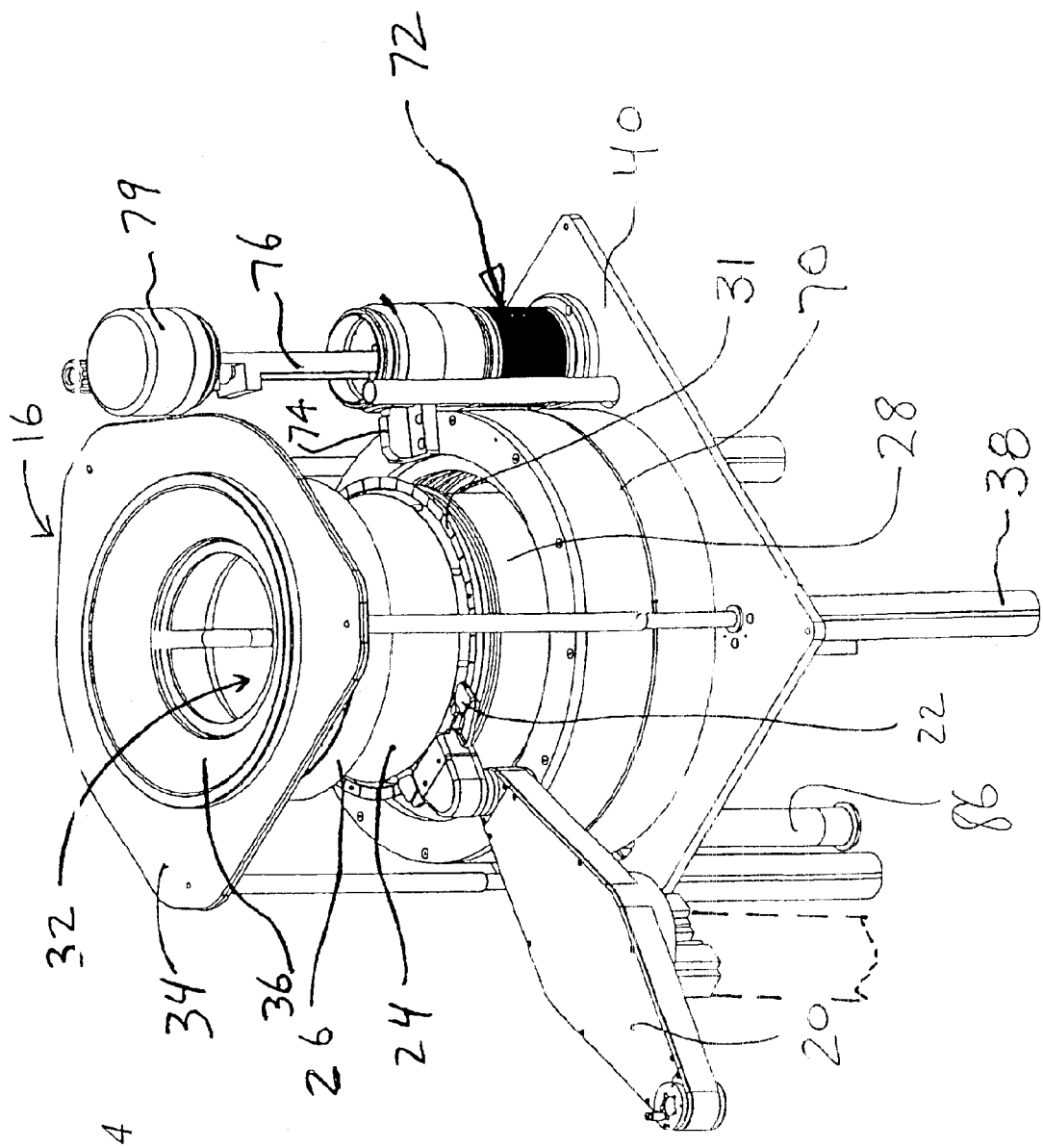
FIG. 4 is a perspective view of the processor of FIG. 1 in a load/unload position.

FIGS. 2 and 4 illustrate the workpiece processor 16 in an up, open or workpiece load/unload position. While in the open position, a workpiece 24 may be loaded and unloaded to and from the processor 16. The robot arm 20, includes an end effector 22 for loading and unloading a workpiece 24 into and out of the processor 16. In a preferred embodiment, the robot arm 20 is supported on a robot base that moves linearly along a track 23 in the space 18. The robot moves within the enclosure for delivering workpieces to and from the various processing stations 14. Preferably the processors 16 are arranged in first and second rows as shown in FIG. 3, with first and second robots 20 loading and unloading workpieces only into processors in the first and second rows, respectively. However, other designs may also be used. For example, a single robot may be used to load and unload all processors 16. Alternatively, two robots may be used, with crossover operation, so that either robot can load and unload any processor 16.

Figure 5:
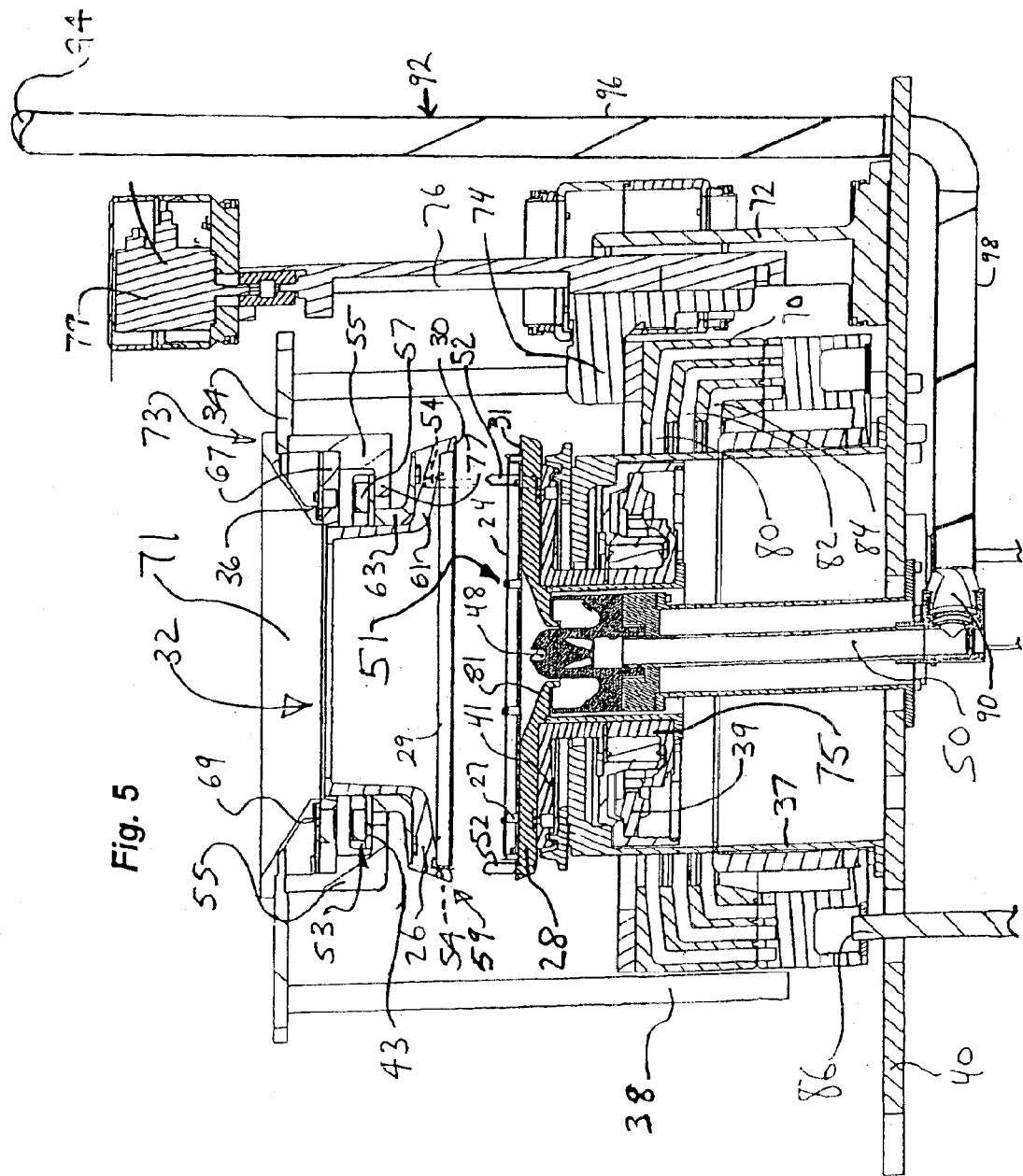
FIG. 5 is a section view of the processor of FIG. 4.
Figure 8:
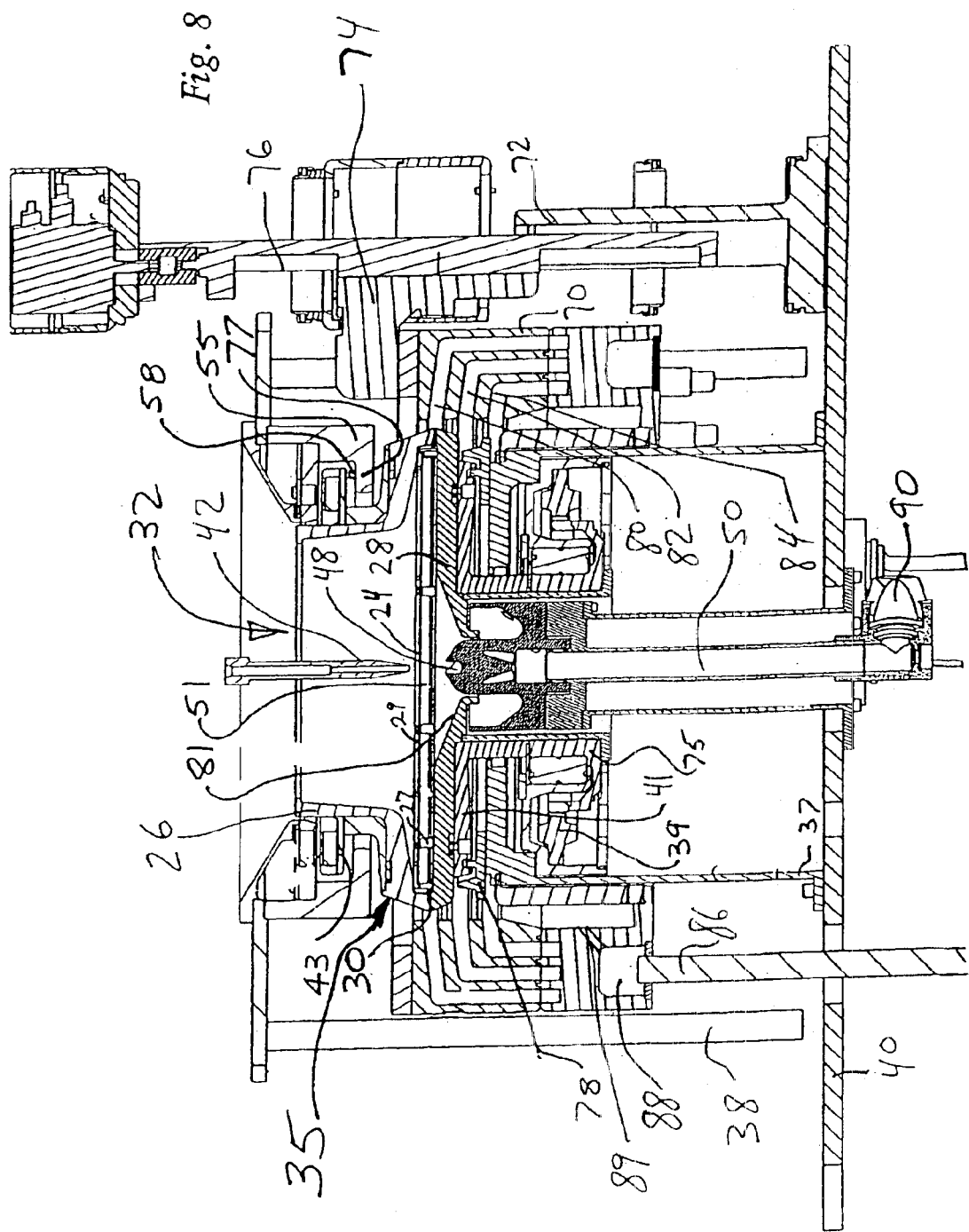
FIG. 8 is a section view of the processor of FIG. 7.

Turing to FIG. 5, the processor 16 includes an upper rotor 26 that is engageable to a lower rotor 28 to form a processing chamber 51 (shown in FIG. 8). In the illustrated embodiment, the workpiece 24 has flat upper and lower surfaces.

The upper rotor 26 is preferably annular with a relatively large central opening 32. The opening 32 preferably has a diameter that is 20–80%, 30–70%, or 40–60% greater than the diameter of a workpiece 24. For example, if the processor is configured to process 200 mm diameter wafers, the diameter of the opening 32 is preferably between 100 and 150 mm in diameter, more preferably approximately 125 mm in diameter.

Figure 7:
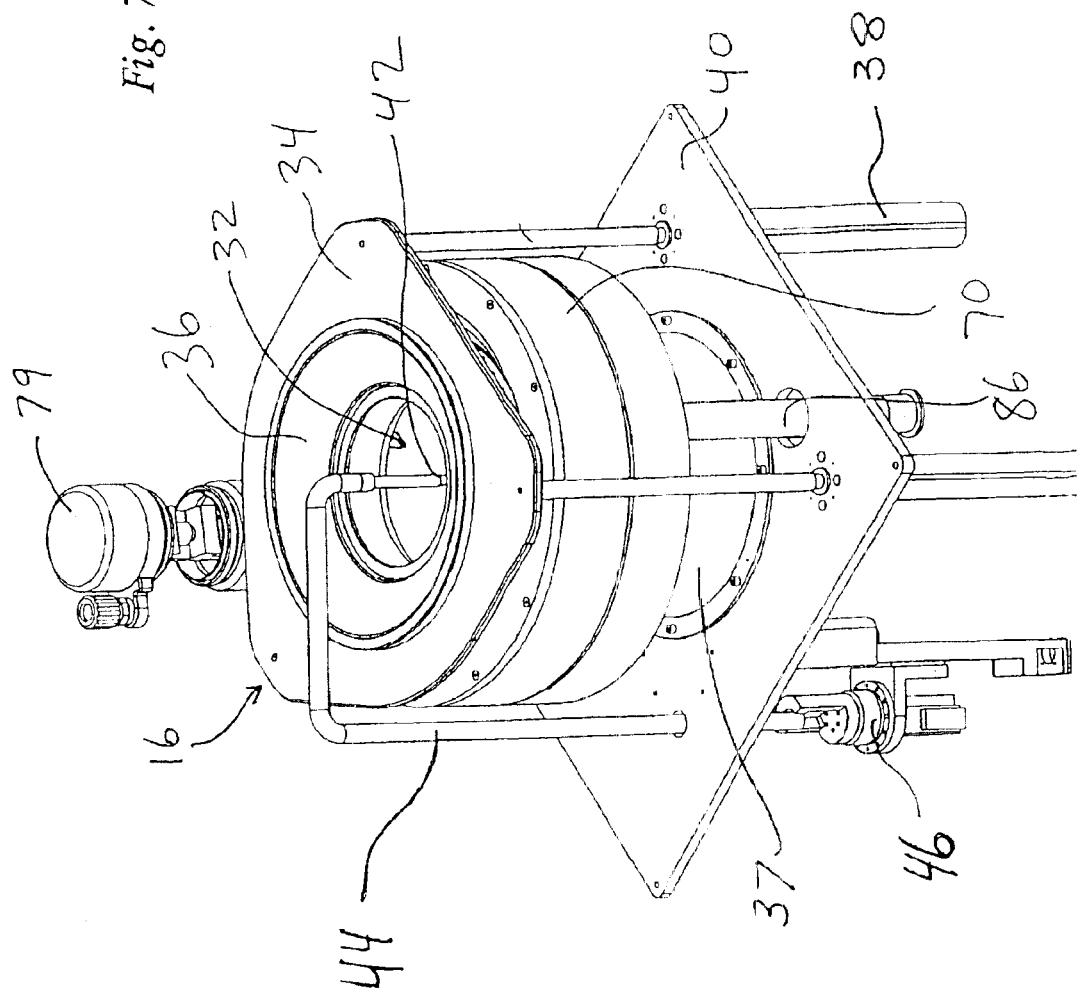
FIG. 7 is a perspective view of the processor of FIGS. 2 and 4 shown in a processing position.
Figure 9:
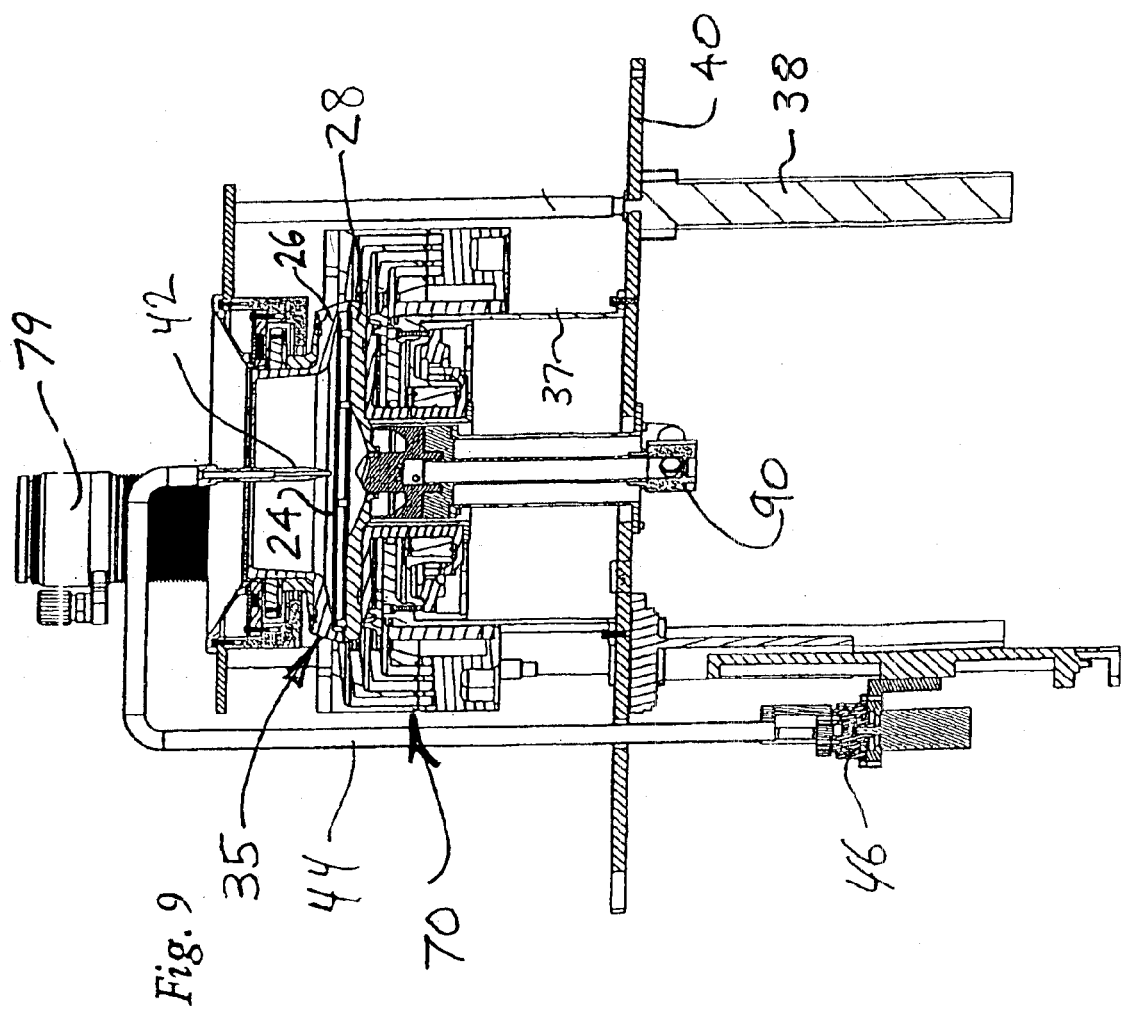
FIG. 9 is a cross-sectional view of the processor of FIG. 7 with a moveable fluid delivery tube directed into the processing chamber.

One or more pneumatic air cylinders 38 or other actuators are attached to the support plate 34 for raising and lowering the upper rotor 26 between the open position illustrated in FIGS. 4 and 5, and the closed position illustrated in FIGS. 7–9.

The lower rotor 28 is preferably fixed in position on a base 40 such that the upper rotor 26 is lowerable to engage or contact the lower rotor 28 to form the processing chamber 51. In an alternative embodiment, the lower rotor 28 may be lifted to engage a fixed upper rotor 26, or the two rotors 26, 28 may be moveable toward one another to form the process chamber 51.

As shown in FIGS. 5 and 8, workpiece 24 is preferably supported in the processing chamber on a plurality of lower supports 27 extending upwardly from the lower rotor 28. Upper support pins 29 on the upper rotor 26 generally tend to limit upward movement of the workpiece off of the lower supports 27, as illustrated in FIG. 5. The workpiece 24 may alternatively be secured, as described in U.S. Pat. No. 6,423,642.

Referring to FIG. 5, an annular housing 55 is attached to the plate 34. An annular flange 43 on the upper rotor 26 is located within an annular slot 53 in the housing 55. A lower magnet ring 57 is attached on top of the flange 43. The upper rotor 26, the flange 43 and magnet ring 57 form an upper rotor assembly 59 which spins as a unit within the housing 55. The upper rotor 26 preferably has an inner PVDF or Teflon (Flourine resins) liner 61 attached to a metal, e.g., stainless steel ring 63, which supports the flange 51. The lower rotor is also preferably PVDF or Teflon. Three pins 52 extend up at the perimeter of the lower rotor 28 for engagement or insertion into openings or receptacles 54 in the upper rotor. The pins 52 have tapered conical tips to align the upper rotor with the lower rotor, as they are brought together. The pins 52 also transmit torque from the lower rotor to the upper rotor, as the rotors spin together as a rotor unit during processing.

Referring still to FIG. 5, a ring plate 67 is attached to the housing 55. The top end of the upper rotor 26 extends up through the ring plate 67. An upper magnet ring 69 is attached to the ring plate 67. The upper magnet ring 69 repels the lower magnet ring 57. The ring plate 67 has a conical section 71 which overlies and is attached to the plate 34. The plate 34, housing 55, ring plate 67 and conical section 71, and the upper magnet ring 69, form a housing assembly 73, which moves vertically via the actuators 38, but does not rotate. Rather, the upper rotor assembly 59 rotates within the stationary housing assembly 73. As shown in FIG. 5, with the processor 16 in the open or up position, the flange 43 of the upper rotor assembly 59 rests on the annular lip or ledge 77 of the housing 55, with no other contact between the rotor assembly 59 and the housing assembly 73. Anti-clocking pins 58 (FIG. 8) extend up from the lip 77 into the flange 43 when the processor is in the open or up position, to keep the upper rotor in angular alignment with the lower rotor.

As shown in FIG. 8, with the processor 16 in the down or closed position, there is no physical contact between the upper rotor assembly 59 and any part of the housing 55 or housing assembly 73. The repelling force of the magnet rings 57 and 69 drives the upper rotor assembly 59 down into contact with lower rotor 28, without physical contact. The magnet rings 57 and 69 may be replaced by individual magnets, electro-magnets or other magnetic elements.

Since the upper rotor 26 has no physical or mechanical connection with the upper rotor 26 or upper rotor assembly 59, and the surrounding structure, such as the housing 55, plate 67 or plate 34, the upper rotor 26 can automatically align itself with the lower rotor 28, when they are brought together. The need for precise alignment of the upper rotor to the lower rotor is therefore avoided. In addition, as there is no physical contact between the fixed housing assembly 73 and the rotating rotor assembly 59 during processing, the potential for generating contaminant particles is greatly reduced.

A face seal or other sealing element 31, shown in FIG. 5, may be used to form a seal between the upper and lower rotors 26, 28 when they are brought together. For some applications, no seal is needed. The upper and lower rotors 26, 28 preferably contact one another only at the seal. The seal may be located on an interior face of one or both of the rotors 26, 28, and is preferably located around the perimeter of the rotors.

Referring to FIG. 8, when the rotors 26, 28 are brought together, they form a combined rotor unit 35 rotatable via a motor 39 supported on a base 40. The motor 39 is contained in a motor housing 37 attached to a base plate 40 or the frame 12. A motor rotor 75 is joined to a backing plate 41 which is attached to and supports the lower rotor 28. As shown in FIG. 5, the motor rotor 75 has a diameter which is at least 20, 30, 40, 50, 60, 70, or 80% of the diameter of the workpiece. This allows for improved dynamic balancing of the system, and less vibration. Turning back to FIG. 8, a barrier ring 78 forms a tortuous path with the bottom of the backing plate 41. This helps to reduce migration of any particles from the motor outwardly and up towards the workpiece. A conical depression at the center of the lower rotor forms a sump 81 which collects and drains away stray liquid. Drain outlets 30 extend through the upper rotor, as shown in FIG. 5.

The large diameter in the motor 39 provides a torque advantage as compared to conventional motors. As a result, the motor 39 has greater rpm and acceleration capabilities than typical motors used in workpiece processing systems. For example, the large bore motor 39 can accelerate from 0 to 1800 rpm in approximately 2 to 4 seconds, as compared to motors used in typical workpiece processing systems that generally accelerate from 0 to 1800 rpm in approximately 14 to 18 seconds. Additionally, motors typically used in workpiece processing systems have maximum rotational velocities of 1800 to 2000 rpm. The large bore motor 39, conversely, preferably has a maximum rotational velocity of 3800 to 4200 rpm, or approximately 4000 rpm. By using a motor 39 with greater rpm and acceleration capabilities, the workpiece processing system 10 can dry workpieces more quickly.

When the rotor unit 35 rotates, air is drawn into the processing chamber 51 through the opening or bore 32 in the upper rotor 26. The opening 32 is large relative to the chamber outlets. This creates a low pressure differential within the processing chamber. This low pressure differential results in air flowing into the processing chamber at a low velocity. As a result, significantly fewer contaminant particles are likely to be drawn into the processing chamber by the incoming airflow, in comparison to existing designs. This reduces the chances of the workpiece becoming contaminated.

As illustrated in FIGS. 7–9, an upper nozzle 42 or fluid applying device can be positioned within the upper rotor 26. The nozzle 42 supplies one or more processing fluids to an upper surface of the workpiece 24. Additional nozzles may be provided for separately supplying processing chemicals, rinsing fluids, and/or drying fluids or gases. Alternatively, a single nozzle 42 may be used to supply all of the fluids required for processing.

The upper nozzle 42 is attached to an end of a relatively inflexible upper fluid delivery tube or line 44. The upper fluid delivery line 44 is attached to a motorized lifting and rotating mechanism 46, which can raise and lower, as well as pivot, the upper fluid delivery line 44 and the upper nozzle or outlet 42 in a back and forth alternating movement.

Additionally, the upper nozzle 42 may be lifted up and out of the upper rotor 26 and pivoted away for processing steps not requiring a nozzle, or so that the upper rotor 26 may be raised into the open or workpiece-receiving position.

Figure 10:
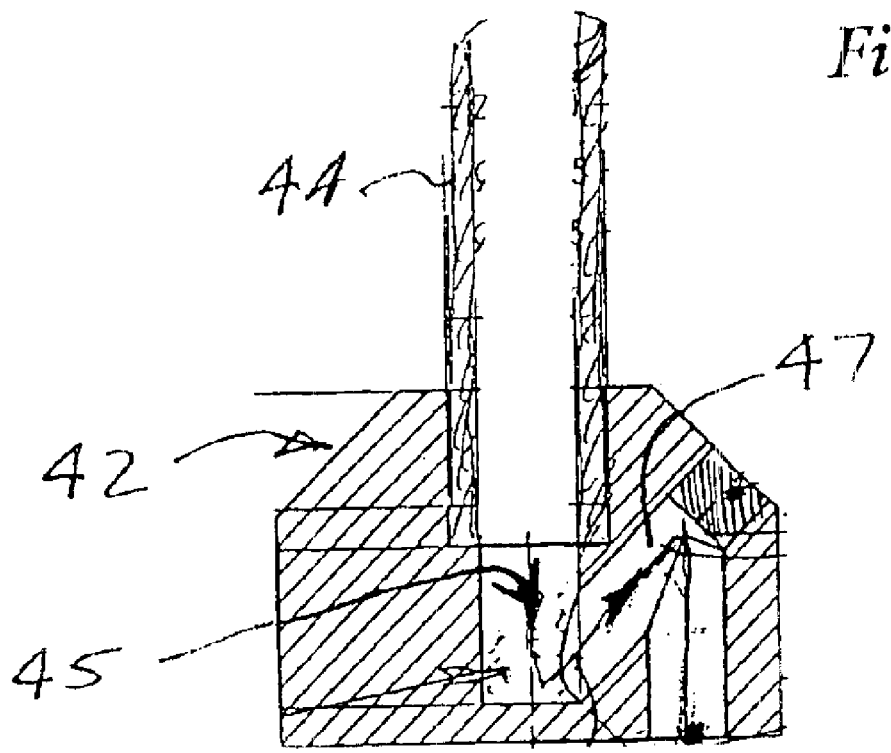
FIG. 10 is a cross-sectional view of a fluid delivery line having a fluid collection area.

As illustrated in FIG. 10, upper nozzle 42 may include a fluid collection area 45. In existing systems, there is a potential for excess fluid to drip from the upper nozzle onto the workpiece after fluid delivery has been stopped. This can lead to workpiece contamination or other defects. Suck-back and gas purging techniques have been used in an attempt to completely empty the fluid delivery tube, but residual drops often still occur. Thus, the collection area 45 may be used with suck-back or purging techniques, to collect the residual fluid so that it does not drip into the processing chamber.

Figure 11:
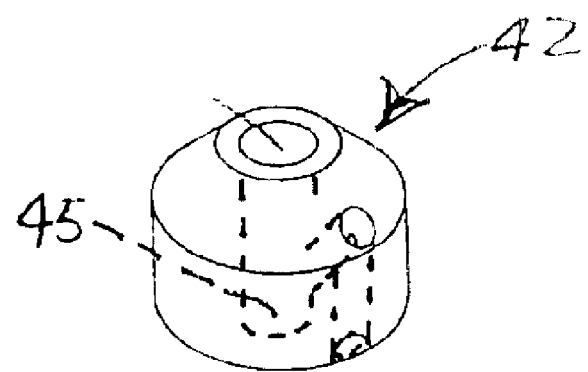
FIG. 11 is a perspective view of a nozzle or liquid supply outlet having a fluid collection area.
Figure 12:
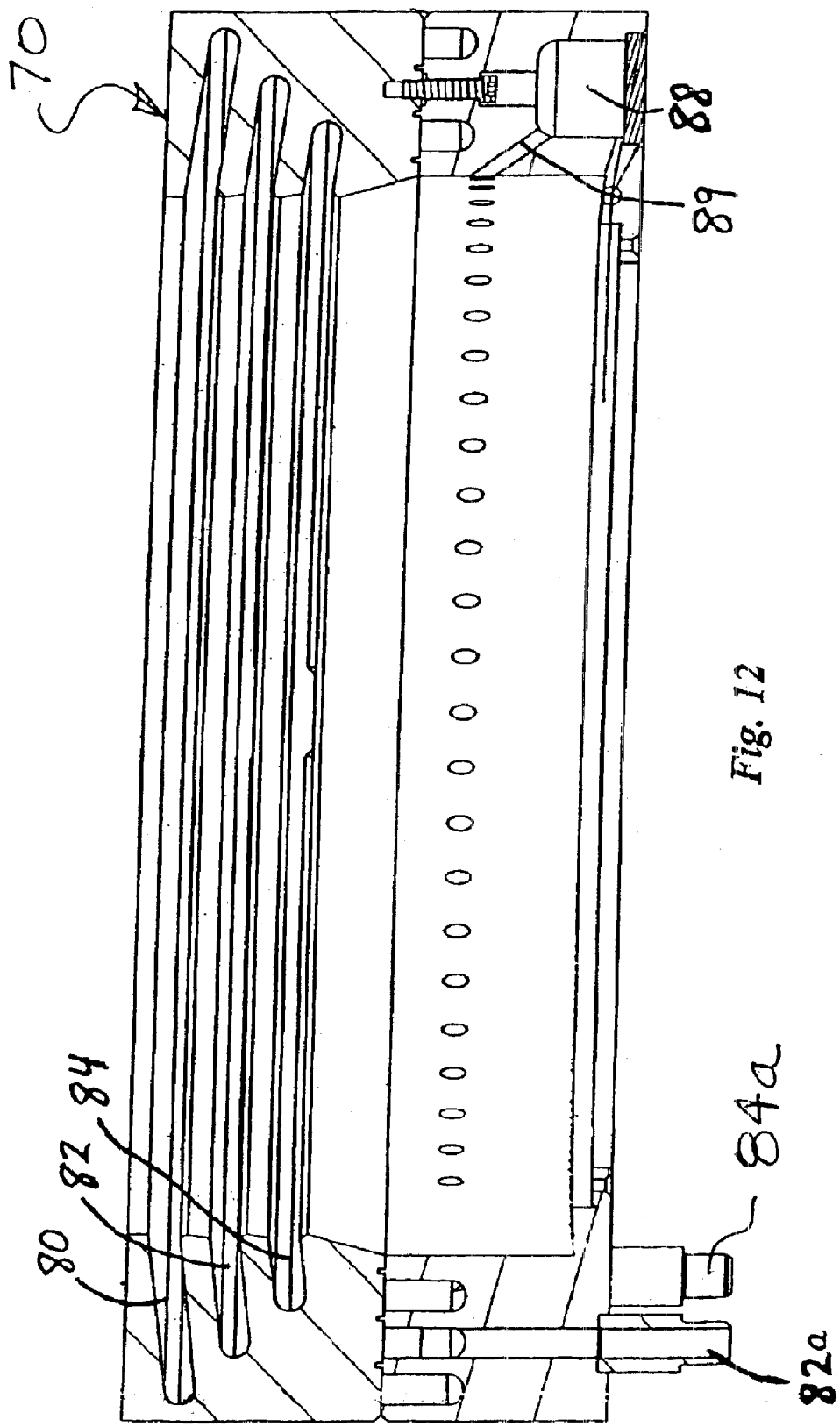
FIG. 12 is a first cross-sectional view of a drainage system of the processor of FIGS. 2, 4, and 7.
Figure 13:
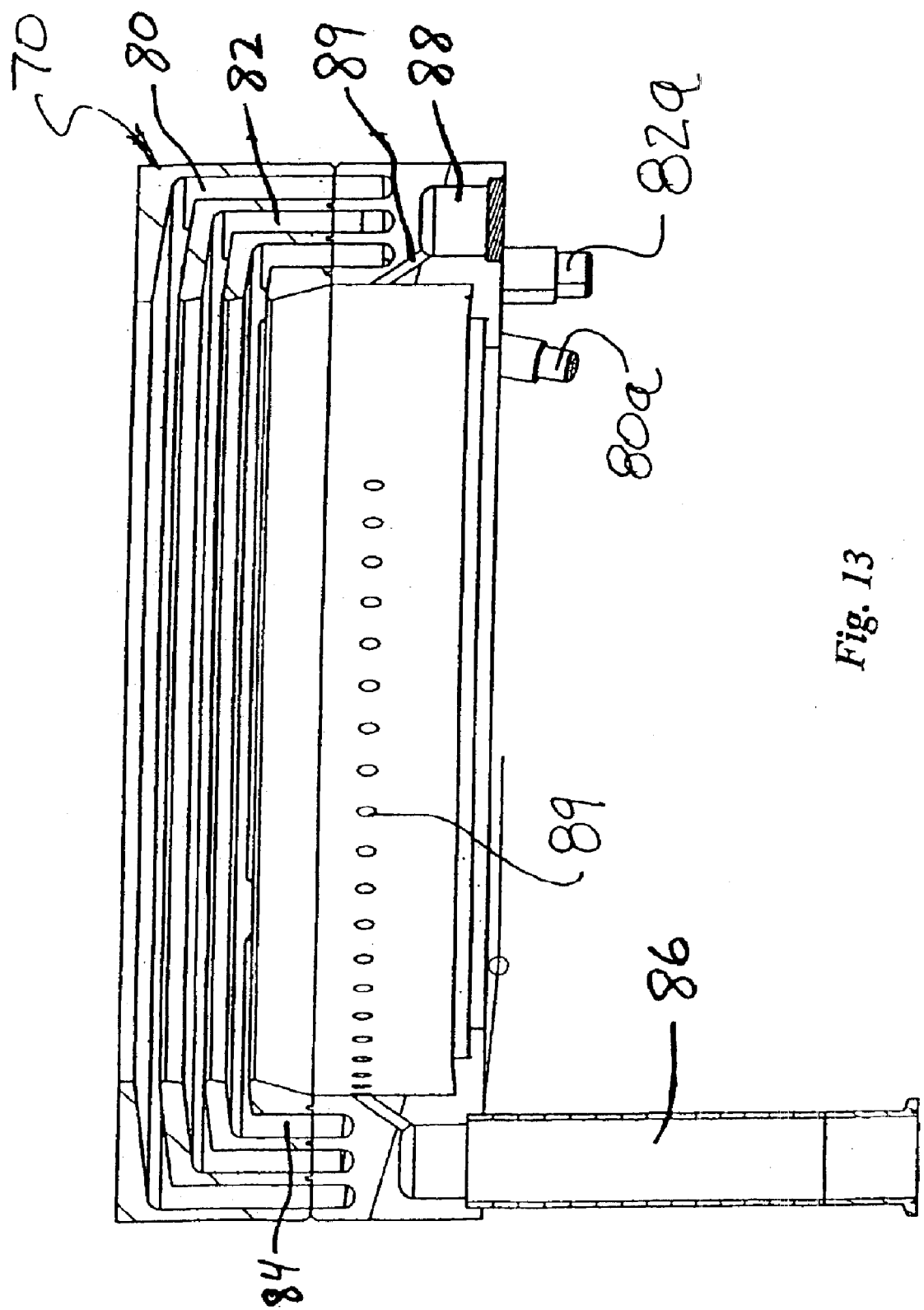
FIG. 13 is a second cross-sectional view of a drainage system of the processor of FIGS. 2, 4, and 7.
Figure 14B:
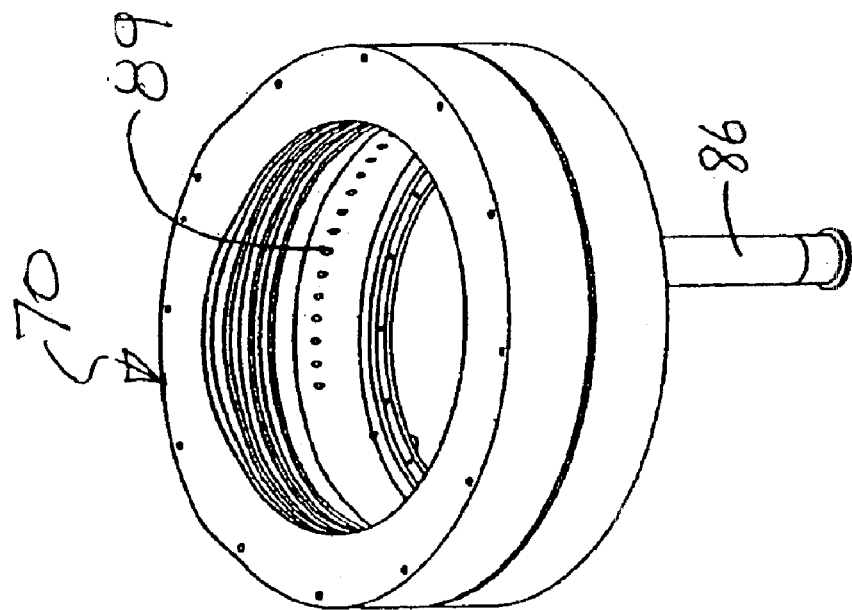
FIG. 14B is an upper perspective view of the drainage system of FIGS. 12 and 13.
Figure 14A:
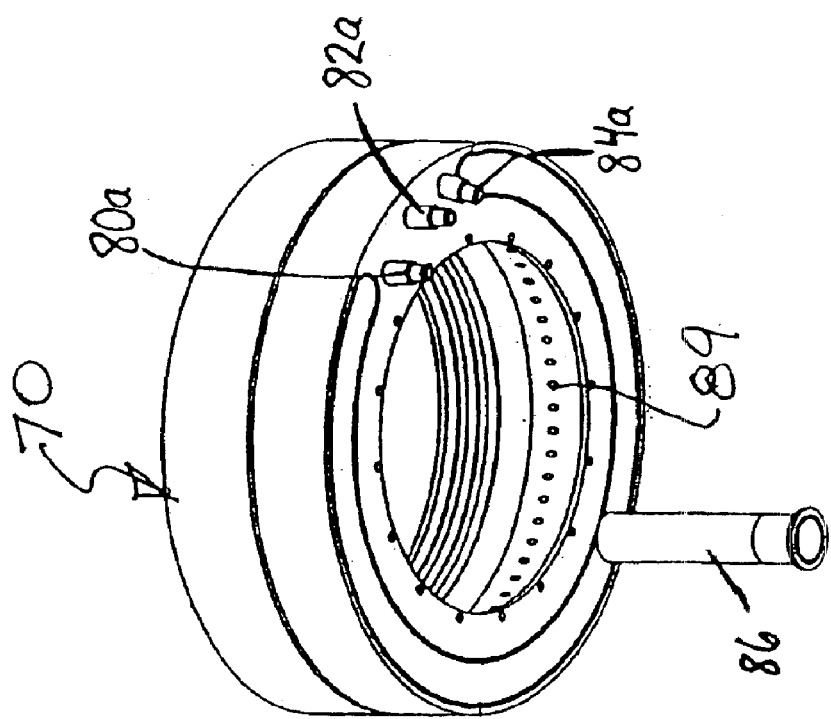
FIG. 14A is a lower perspective view of the drainage system of FIGS. 12 and 13.

The fluid collection area 45 is preferably formed by a first tube section 47 extending upwardly at an angle from the upper fluid delivery line 44. The fluid collection area 45 is preferably large enough to contain several drops of fluid. As illustrated in FIG. 11, a nozzle 42 incorporating a collection area 45 may be manufactured as a separate component that may be attached to the end of the upper fluid delivery tube or line 44.

As illustrated in FIGS. 5 and 8, a lower nozzle 48 or other fluid delivery outlet is preferably centrally positioned beneath the workpiece 24 for delivering one or more processing fluids to a lower surface of the workpiece 24. A lower fluid delivery tube or line 50 is attached to the lower nozzle 48 for supplying fluid to the lower nozzle 48. The lower fluid delivery line 50 may be supplied with processing fluid from the same or from different fluid reservoir(s) from which the upper fluid delivery line 44 is supplied. Thus, the upper and lower surfaces of the workpiece 24 may be processed simultaneously, or sequentially, with the same or with different processing fluids. The nozzles 42 and 48 may be spray nozzles or applicators of any shape or pattern, or they may be simple outlets or openings, to supply a process liquid or gas or vapor to the workpiece, in any format or condition.

In a preferred embodiment, as illustrated in FIG. 5, an air supply line or snorkel 92 has an inlet or opening 94 located vertically above the processing chamber 51. Typically, the inlet 94 is near the top of the system enclosure 15, shown in FIG. 1. A vertical riser section 96 of the snorkel 92 connects into a horizontal section 98 and into a valve 90, which is joined to the lower fluid line 50. When the rotor assembly spins, clean air (not recycled air) is drawn through the snorkel 92 and is supplied to the bottom surface of the workpiece. The low air pressure adjacent to the center of the spinning rotor assembly draws the clean air in through the lower nozzle 50. The air sprays upwardly from the lower nozzle 50 onto the lower surface of the workpiece. Drying of the lower surface is therefore achieved more quickly.

The drain outlets 30 are spaced apart around the perimeter of the upper rotor 26, as shown in FIG. 5. The drain outlets 30 allow fluid to exit from the processing chamber 51 via centrifugal force when the rotor unit 35 spins during processing. The drain outlets 30 alternatively can be in the lower rotor or on both the upper and lower rotors. The drain outlets 30 can also be provided in other forms, such as a slot or an opening between the rotors.

As shown in FIGS. 4, 5 and 8, an annular drain assembly 70 is positioned around the rotor unit 35. The drain assembly 70 is preferably vertically moveable via a lifting mechanism or elevator 72. The elevator 72 includes an armature 74 attached to the drain assembly 70. A motor 79 turns a jack screw 76 to raise and lower the armature 74 and the drain assembly 70.

The drain assembly 70 includes a plurality of drain paths that are separately alignable with the outlets 30 in the processing chamber. Three drain paths 80, 82, 84 are shown in FIGS. 5 and 8, but any desired number of drain paths may be included in the drain assembly 70. Multiple drain paths are provided so that different processing liquids (including deionized (DI) water), may be removed from the processing chamber through separate paths. This helps to avoid cross-contamination between the processing liquids.

Turning to FIGS. 12–14B, the drain paths 80, 82, 84 each preferably lead to a separate drain tube 80a, 82a, 84a, respectively, which lead out of the processor 16. The drain assembly 70 also preferably includes an exhaust plenum 88 shown in FIGS. 12 and 13 which draws in exhaust. Exhaust ports 89 extend through the drain assembly 70 and connect into the exhaust plenum. An exhaust tube 86 provides an exhaust from the system.

Figure 6:
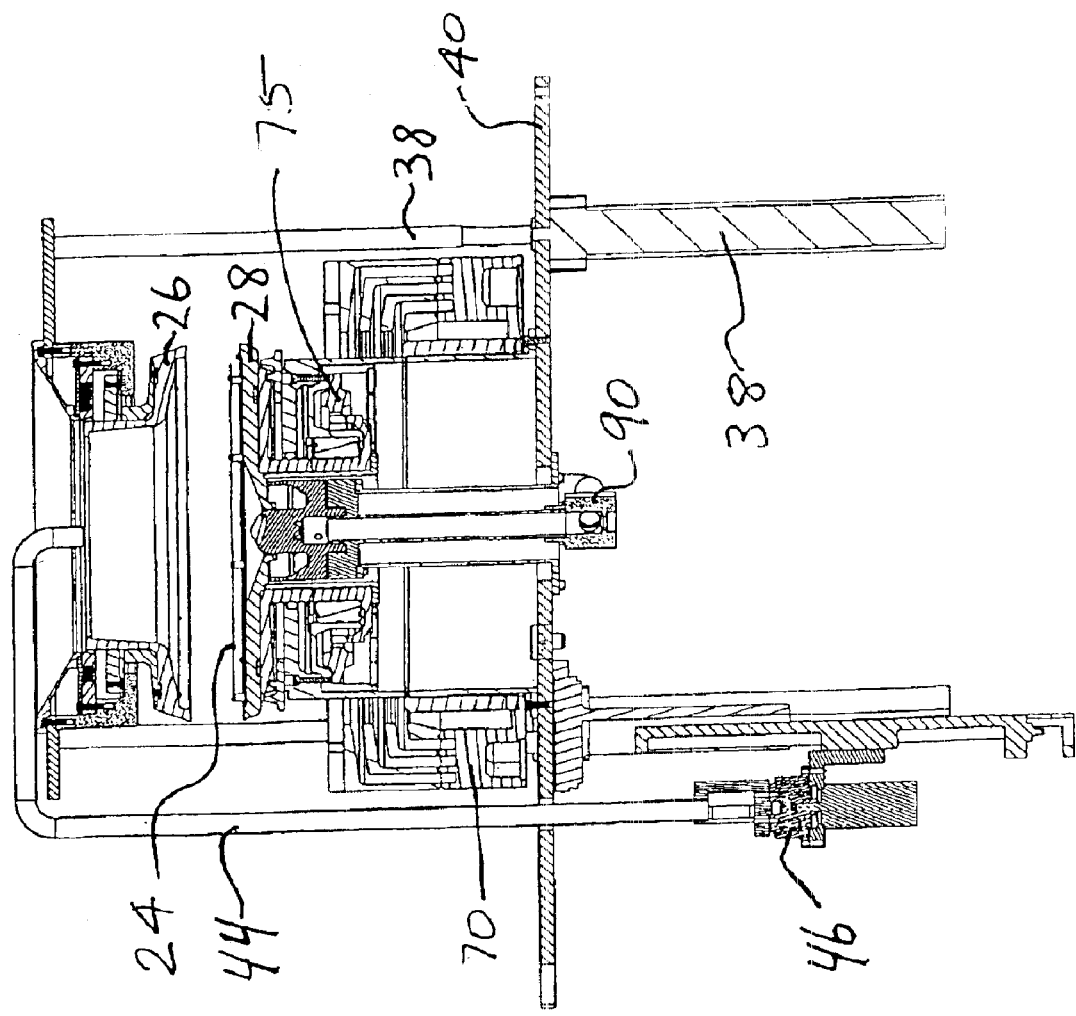
FIG. 6 is a section view of the processor of FIG. 4 with a moveable fluid delivery tube directed into the processing chamber.

When the upper rotor member 26 is in the open or up position, the drain assembly 70 is preferably at its lowest position, adjacent to the base 40, as illustrated in FIGS. 4–6. This allows for loading and unloading of a workpiece 24 into and out of the processor 16, as shown in FIG. 4. When the upper rotor 26 is lowered into the closed or processing position, the drain assembly 70 is raised by the elevator 72 to align one of the drain path 80, 82, or 84 with the outlets 30 in the processing chamber, as illustrated in FIGS. 7–9.

Processing fluid is removed from the processing chamber 51 through the outlets 30 via centrifugal force generated by rotation of the rotor unit 35. The fluid then flows along the drain path that is aligned with the processing chamber outlets, and continues out of the processor 16 through the corresponding drain tube. The processing fluid may then be recycled or sent to a disposal area.

The inner surface of the drain assembly 70 is preferably separated from the outer surface of the rotor unit 35 by a gap of approximately 0.125 to 0.250 inches, more preferably 0.175 to 0.200 inches. When the drain assembly 70 is lowered and/or when the upper rotor 26 is raised, air flows downward through the gap toward the system exhaust. This airflow entrains particles and fluids and pulls them away from the workpiece toward the system exhaust. As a result, when the drain assembly 70 is lowered, and the upper rotor 26 is raised to allow access to the workpiece, few, if any, particles and contaminants are present in the processing chamber. Thus, particle re-deposition on the workpiece is substantially reduced or eliminated.

In use, a pod, cassette, or container 21 is moved onto the input/output station 19. If the container is sealed, such as a FOUP or FOSBY containers, the door is removed, via robotic actuators in the system 10. The robot(s) 20 then remove a workpiece 24 from the container 21 and place the workpiece 24 in a processor 16, as shown in FIG. 4. The processor 16 is in the up or open position, and the drain assembly 70 is in the down position, as shown in FIG. 4. While the processor 16 could also be provided as a stand alone manually loaded system (without the loader 19, the robots 20 or the enclosure 15), the automated system shown in FIGS. 1 and 3 is preferred.

The workpiece 24 is positioned on the workpiece supports 27 on the lower rotor 28. The upper rotor 26 is then lowered down via the actuators 38 and engages with the lower rotor member 28 to form a processing chamber 51 around the workpiece 24. The repulsion of the magnets or magnet rings 57 and 69 forces the upper rotor against the lower rotor, with the face seal forming a seal at the perimeter. The spacing members or support pins 29 on the upper rotor member 26 closely approach or contact the upper surface of the workpiece 24 to secure or confine the workpiece in place.

Once the rotor unit 35 is in the closed or processing position, the drain assembly 70 is raised by the elevator 72 so that it is positioned around the rotor unit. A drain path 80, for removing the first processing fluid used to process the workpiece 24, is aligned with the outlets 30. The spacing between the entrance to the drain paths 80, 82, 84 and the outlets 30 is minimized, so that liquid exiting the outlets 30 moves into the drain paths, rather than running down the sides of the lower rotor. Alternatively, annular ring seals may be used to help move liquid from the outlets 30 into the drain paths, without dripping or leaking.

After the drain path 80 is properly aligned, a processing fluid is supplied via one or both of the upper and lower fluid supply tubes 44, 50 to one or both of the upper and lower nozzles or outlets 42, 28, which deliver the processing fluid to the upper and/or lower surfaces of the workpiece 24. The rotor unit is generally rotated by the motor 39 to generate a continuous flow of fluid across the surfaces of the workpiece 24 via centrifugal force. Processing fluid is thus driven across the workpiece surfaces in a direction radially outward from the center of the workpiece 24 to the edges of the workpiece 24. The upper nozzle 42 may be moved back and forth within the bore 32 by the motorized lifting and rotating mechanism 46, to more evenly distribute processing fluid to the upper workpiece surface.

As the rotor unit rotates, air is drawn into the processing chamber through the opening 32 in the upper rotor assembly 59 and housing assembly 73. As the opening 32 is relatively large, and the processing chamber 51 is substantially closed, except at the outlets 30, air flows through the processing chamber at a relatively low velocity, thus reducing the likelihood of entraining particles that could contaminate the workpiece. In a preferred embodiment, the air flowing through the processing chamber is filtered through one or more mini-environment filters to further reduce the likelihood that particles are delivered to the workpiece via airflow.

At the perimeter of the chamber 51, used processing fluid moves out of the processing chamber 51 through the outlets 30, due to the centrifugal force. The fluid then flows along the drain path that is aligned with the processing chamber outlets 30, and continues out of the processor 16 through the corresponding drain tube. The spent fluid may be delivered to a recycling system for reuse, or to a disposal area for proper disposal. The drain tubes 80a, 82a, 84a are preferably flexible and are mounted to move up and down with the drain assembly 70.

When the step of processing with the first processing fluid is completed, a purge gas, such as $N_2$ gas, is preferably sprayed from the nozzles 24 and/or 42 toward the outlets 30 to help remove any remaining processing fluid from the chamber. Depending on whether a second processing fluid or a DI rinse water is to be used next, the drain assembly 70 is raised further by the lift mechanism 72 to align the appropriate drain path 82 or 84 with the outlets 30.

For example, if a rinsing step performed with DI rinse water is to be performed next, the elevator 72 raises the drain assembly 70 until drain path 84, or whichever drain path has been designated for DI water draining, is aligned with the outlets 30 in the processing chamber. DI rinse water is then sprayed onto the workpiece surfaces and moves across the workpiece surfaces to the exterior perimeter of the workpiece 24 via centrifugal force. The DI rinse water flows through the outlets 30 into the drain path 84. The DI rinse water flows along the drain path 84 out through the drain tube 84a for removal from the workpiece processor 16. As separate drain paths are used for the first processing fluid and the DI rinse water, these liquids are not mixed when they exit the processing chamber 51, and cross-contamination therefore does not occur.

Similar steps may be performed for one or more additional processing fluids. A rinsing step may be performed after each processing step, or may be performed after all processing steps are completed. A drying step performed with isopropyl alcohol (IPA) vapor or another drying fluid may be performed after the final processing or rinsing step. In a preferred embodiment, one drain path is assigned to each type of processing fluid used, including the DI rinse water. Thus, cross-contamination between the different processing liquids, as well as the DI rinse water, is avoided. Alternatively, single use processing liquids may share a drain path with each other and/or with the DI rinse water.

Once processing has been completed, the drain assembly 70 is lowered and the upper rotor member 26 is raised to allow access to the workpiece 24, as shown in FIGS. 4–5. In this open position, the workpiece 24 may be removed from the processing chamber and another workpiece may be placed into the processing chamber.

The rotor and drain components in the processing system 10 may be made of any suitable material, such as Teflon® (synthetic fluorine-containing resins) or stainless steel. Any processing fluids typically used to process workpieces, such as semiconductor wafers, may be used in the processing system 10. For example, aqueous or gaseous ozone, aqueous or gaseous HF or HCL, ammonia, nitrogen gas, IPA vapor, DI rinse water, $H_2SO_4$, solvents, etc. may be used to perform the various processing steps. In applications where harsh acids or solvents are used, such as HF or $H_2SO_4$, it is preferable to use Teflon® processing components so that the rotor components and drain are not damaged by the processing chemistries. Preferably the upper nozzle or outlet 42 and lower nozzle 48 are connected with, and have separate outlets for DI water, clean dry air, nitrogen, and one or more of the liquid process chemicals listed above. One or more valves 90 near the lower end of the tube 50 control flow of liquids and gases through the lower nozzle 48. The lower nozzle 48 may include, e.g., four separate sub-nozzles, each dedicated to a single liquid or gas.

Additional system components, such as an IPA vaporizer, a DI water supply, optional heating elements, optional flowmeters, optional flow regulators/temperature sensors, valve mechanisms, etc. may also be included in the processing system, as in existing systems. All of the various components of the processing system 10 may be under the control of a controller unit 17 having appropriate software programming.

The workpiece processing system and methods described herein provide numerous and substantial benefits. Some of the advantages and benefits are as follows:

1. The opening 32 in the upper rotor 26 allows air to flow through the processing chamber at a low pressure differential. The resulting velocity of this airflow is relatively low due to the open inlet and restricted outlet at the chamber seal. This low velocity reduces the possibility of drawing particles into the chamber during processing.

2. Use of a magnetic (non-contact) force to couple the upper and lower rotors 26, 28 allows for minimal or no engagement between mechanical features of the two portions. This arrangement eliminates several pocketed areas found in existing equipment and provides effective rinsing/ cleaning of the chamber surfaces. The need for precise alignment of the upper and lower rotors is avoided.

3. Mounting the rotor motor 39 on the frame 12 allows for a stable and rigid connection that reduces vibration. Consequently, there is more uniform processing and less wear and less particle generation. In addition, the motor is below the workpiece. Any particles generated by the motor, therefore, tend to move downwardly away from the workpiece.

4. Dedicated drain zones allow each of the different process chemistries to be removed from the processing chamber using an isolated plumbing path, which eliminates cross contamination from other chemistries or DI water.

5. The motor 39 has exceptional torque capability, which allows the motor shaft to be more massive without significantly affecting performance. The upper and lower rotors 26, 28 are therefore a smaller portion of the total spinning mass. As a result, the associated in-balance of the rotor unit (due to either machine tolerance or retained chemical volume) is less of a source of vibration. Additionally, the large motor diameter provides a torque advantage for the motor, thus allowing the motor to have greater rpm and acceleration capabilities than motors typically used in workpiece processing systems.

6. The opening 32 allows for processing liquids to be applied to the workpiece in a more distributed way because the one or more upper nozzles can move relative to the workpiece center to distribute fluid. This is particularly important near the workpiece center where centrifugal force is a smaller factor, and where large volumes of processing chemistry may need to be applied in a short period of time, or where chemical processing is a function of refreshment rate.

7. Because the drain mechanism 70 moves down away from the rotor unit for workpiece loading and unloading, any residual chemical fumes or atomized particles in the drain mechanism 70 are moved to a lower position than the plane of automation, thus minimizing residual workpiece contamination. Also, a downward airflow, or lip exhaust, is formed in the gap between the processing chamber and the drain mechanism 70, and entrains particles and fluid to draw them away from the workpiece.

8. Because the upper and lower rotors form a "closed" rotor unit or processing chamber when engaged with one another, the processing chamber surfaces may be self-cleaned via an automated spray process using spray elements or nozzles within the rotor unit. Additionally, the upper rotor of the closed processing chamber forms a barrier against particles ejected from a workpiece during processing, thus substantially preventing the particles from re-depositing on the workpiece.

While the rotors, workpieces, and other components are described as having diameters, they can also have non-round shapes.

While embodiments and applications of the present invention have been shown and described, it will be apparent to one skilled in the art that other modifications are possible without departing from the inventive concepts herein. The invention, therefore, is not to be restricted except by the following claims and their equivalents.

What is claimed is:

1. A system for processing a workpiece, comprising:
a plurality of workpiece processors, with at least one of the workpiece processors comprising:
an upper rotor having a through air flow opening with a diameter which is about from 20 to 80% of the diameter of the workpiece;
a lower rotor engageable to the upper rotor to form a workpiece processing chamber; and
a robot moveable between the workpiece processors for loading and unloading a workpiece into and out of one or more processors.

2. The system of claim 1 further comprising an upper fluid applicator extending into the through opening in the upper rotor, to provide a processing fluid to an upper surface of the workpiece.

3. The system of claim 2 further comprising an actuator for moving the upper fluid applicator within the through opening for distributing a processing fluid to different portions of the workpiece.

4. The system of claim 3 wherein the upper fluid applicator comprises a nozzle having a collection section for collecting processing fluid when fluid delivery to the upper nozzle is discontinued so that excess processing fluid does not drip from the upper nozzle into the processing chamber.

5. The system of claim 1 further comprising a lower fluid applicator extending through the lower rotor for introducing a processing fluid to a lower surface of a workpiece.

6. The system of claim 1 further comprising a plurality of spacing members for holding a workpiece between the upper and lower rotor members.

7. The system of claim 1 further comprising a spin motor linked to the lower rotor.

8. The system of claim 7 wherein the spin motor has a maximum rotational velocity of approximately 4000 rpm.

9. The system of claim 7 wherein the spin motor accelerates from 0 to 1800 rpm in approximately 2 to 4 seconds.

10. The apparatus of claim 1 further comprising magnet means for engaging the upper and lower rotors.

11. The system of claim 1 further comprising a sump at a central area of the lower rotor.

12. The system of claim 1 further comprising a moveable drain assembly including a plurality of drain paths, with each drain path separately alignable with the processing chamber by vertically moving the drain assembly.

13. The system of claim 1 further comprising an air supply line in communication with the processing chamber and having an inlet located vertically above the processing chamber for delivering clean air into the processing chamber.

14. A system for processing a workpiece, comprising:
a plurality of workpiece processors, with at least one of the workpiece processors comprising:
an upper rotor;
a lower rotor engageable with the upper rotor to form a workpiece processing chamber;
a robot moveable between the processors for loading and unloading workpieces into and out of the processors; and
a moveable drain assembly including a plurality of separate drain paths, with each drain path separately alignable with the processing chamber by moving the drain mechanism to align a single drain path with the processing chamber.

15. The system of claim 14 wherein the lower rotor is at a fixed vertical position, and the upper rotor and the drain assembly are moveable vertically, relative to the lower rotor.

16. The system of claim 14 wherein the upper rotor has a central through opening for air flow having a diameter of 20–80% of the diameter of the workpiece.

17. The system of claim 14 further comprising a nozzle extending into the upper rotor for introducing a processing fluid to an upper surface of a workpiece.

18. The system of claim 14 further comprising a loading station, with the robot moveable from the loading station to one or more of the workpiece processors.

19. The system of claim 14 wherein the workpiece processors are arranged in a first row and a second row, with the robot moveable between the two rows.

20. A system for processing a workpiece, comprising:
a plurality of workpiece processors, with at least one of the workpiece processors comprising:
an upper rotor having a first magnetic element;
a lower rotor having a second magnetic element, with the upper rotor engageable to the lower rotor via interaction of the magnetic elements, to form a workpiece processing chamber; and
a robot moveable between the workpiece processors for loading and unloading a workpiece into and out of one or more processors.

21. The system of claim 20 with the upper rotor having a through opening with a diameter which is 20–80% of the diameter of the workpiece.

22. The system of claim 20 further comprising an upper fluid applicator extending into the through opening in the upper rotor, to provide a processing fluid to an upper surface of the workpiece.

23. The system of claim 20 further comprising an actuator for moving the upper fluid applicator within the through opening for distributing a processing fluid to different portions of the workpiece, and for moving the upper fluid applicator vertically and radially out of the processing chamber.

24. The system of claim 20 further comprising a lower fluid applicator extending through the lower rotor for introducing a processing fluid to a lower surface of a workpiece.

25. The system of claim 20 further comprising a moveable drain assembly including a plurality of drain paths, with each drain path separately alignable with the processing chamber by vertically moving the drain assembly.

26. A system for processing a workpiece, comprising:
a plurality of workpiece processors, with at least one of the workpiece processors comprising:
a first rotor;
a second rotor
engagement means for engaging the first rotor to the second rotor, without the need for physical contact with the first rotor; and
loading means for loading a workpiece into and out of one or more of the processors.

27. The system of claim 26 wherein the engagement means comprises elements for creating magnetic repulsion or attraction between the first and second rotors.

28. The system of claim 26 further comprising drain means for separately draining fluids from the processing chamber.

29. A method of processing a workpiece, comprising the steps of:
placing the workpiece into a first rotor;
engaging a second rotor to the first rotor via a non-contact force, to form a processing chamber around the workpiece;
spinning the first and second rotors; and
applying a first processing fluid to a first side of the workpiece, with the first processing fluid flowing radially outwardly over the first side of the workpiece via centrifugal force.

30. The method of claim 29 further comprising the step of removing the first processing fluid from the processing chamber via a first drain path located in a moveable drain mechanism in communication with the processing chamber.

31. The method of claim 29 wherein the non-contact force comprises magnetic force.

32. A system for processing a workpiece, comprising:
a plurality of workpiece processors, with at least one of the workpiece processors comprising:
an upper rotor;
a lower rotor engageable to the upper rotor to form a workpiece processing chamber;
a moveable drain assembly alignable with the processing chamber, the drain assembly separated from the processing chamber by a gap in which a downward airflow is created when the drain assembly is lowered and/or the upper rotor is raised; and
a robot moveable between the workpiece processors for loading and unloading a workpiece into and out of one or more processors.

33. The system of claim 32 wherein the gap is 0.125 to 0.250 inches wide.

34. A workpiece processor, comprising:
an upper rotor having a through air flow opening;
a lower rotor engageable to the upper rotor to form a workpiece processing chamber;
wherein the through air flow opening in the upper rotor has a diameter which is 20–80% of the diameter of the workpiece.

35. The processor of claim 34 further comprising an upper fluid applicator extending into the through opening in the upper rotor, to provide a processing fluid to an upper surface of the workpiece.

36. The processor of claim 35 further comprising an actuator for moving the upper fluid applicator within the through opening.

37. The processor of claim 35 wherein the upper fluid applicator comprises a nozzle having a collection section for collecting processing fluid when fluid delivery to the upper nozzle is discontinued so that excess processing fluid does not drip from the upper nozzle into the processing chamber.

38. The processor of claim 34 further comprising a lower fluid applicator extending through the lower rotor for introducing a processing fluid to a lower surface of a workpiece.

39. The processor of claim 34 further comprising one or more magnets for engaging the upper and lower rotors.

40. The processor of claim 34 further comprising a moveable drain assembly including a plurality of drain paths, with each drain path separately alignable with the processing chamber by vertically moving the drain assembly.

41. A workpiece processor, comprising:
an upper rotor having a first magnetic element;
a lower rotor having a second magnetic element, with the upper rotor engageable to the lower rotor via interaction of the magnetic elements, to form a workpiece processing chamber; and
fluid inlet extending into the processing chamber to provide a processing fluid onto a workpiece in the processing chamber.

42. A system for processing a workpiece, comprising:
a plurality of workpiece processors, with at least one of the workpiece processors comprising:
an upper rotor having an opening with an area of about 4% to 64% of the area of the workpiece;
a lower rotor engageable to the upper rotor to form a workpiece processing chamber; and
a robot moveable between the workpiece processors for loading and unloading a workpiece into and out of one or more processors.

43. A system for processing a workpiece, comprising:
a plurality of workpiece processors, with at least one of the workpiece processors comprising:

an upper rotor having a through opening;
a lower rotor engageable to the upper rotor to form a workpiece processing chamber;
a spin motor linked to the lower rotor; and
a robot moveable between the workpiece processors for loading and unloading a workpiece into and out of one or more processors.

44. A system for processing a workpiece, comprising:
a plurality of workpiece processors, with at least one of the workpiece processors comprising:
an upper rotor having a through opening;
a lower rotor engageable to the upper rotor to form a workpiece processing chamber;
a sump at a central area of the lower rotor; and
a robot moveable between the workpiece processors for loading and unloading a workpiece into and out of one or more processors.

45. The system of claim 44 wherein the area of the opening is from about 4% to 64% of the area of the workpiece.

46. A system for processing a workpiece, comprising:
a plurality of workpiece processors, with at least one of the workpiece processors comprising:
an upper rotor having a through air flow opening;
a lower rotor engageable to the upper rotor to form a workpiece processing chamber;
an air supply line in communication with the processing chamber and having an inlet located vertically above the processing chamber for delivering clean air into the processing chamber; and
a robot moveable between the workpiece processors for loading and unloading a workpiece into and out of one or more processors.

47. A system for processing a workpiece, comprising:
a plurality of workpiece processors, with at least one of the workpiece processors comprising:
a first rotor;
a second rotor
engagement means for engaging the first rotor to the second rotor, without the need for physical contact with the first rotor, with the engagement means including elements for creating magnetic repulsion or attraction force on a rotor; and
loading means for loading a workpiece into and out of one or more of the processors.

48. A system for processing a workpiece, comprising:
a plurality of workpiece processors, with at least one of the workpiece processors comprising:
a first rotor;
a second rotor
engagement means for engaging the first rotor to the second rotor, without the need for physical contact with the first rotor;
drain means for separately draining fluids from the processing chamber; and
loading means for loading a workpiece into and out of one or more of the processors.

49. The system of claim 48 wherein the engagement means comprises elements for creating magnetic repulsion or attraction on the first or second rotor.

50. A workpiece processor, comprising:
a base housing;
a base magnet on the base housing;
a first rotor rotatable within the base housing;
a second rotor adapted to engage and form a processing chamber with the first rotor;
a rotor magnet on the first rotor, with the rotor magnet repelled by the base magnet.

51. The system of claim 50 further comprising means for spinning the first rotor, with the first rotor making no physical contact with the housing while spinning.

52. The system of claim 50 where the base magnet, or the rotor magnet, or both, comprise a magnet ring.

53. A workpiece processor, comprising:
a fixed, non-rotating housing;
at least one housing magnet on the housing;
a first rotor rotatable within the housing;
at least one rotor magnet on the first rotor;
a second rotor engageable with the first rotor;
and with first rotor biased away from the housing via the rotor magnet repelling the housing magnet.

54. The workpiece processor of claim 53 with the first rotor suspendable within the housing via interaction between the housing magnet and the rotor magnet.

55. The workpiece processor of claim 53 further comprising a through air flow opening in the second rotor, with the through air flow opening having a diameter of from about 20–80% of the diameter of the workpiece.

56. The workpiece processor of claim 53 further comprising a fluid applicator extendible through the through air flow opening in the second rotor.

57. The workpiece processor of claim 53 further comprising a drain assembly vertically moveable relative the first rotor.

58. A workpiece processor, comprising:
an upper rotor having a through air flow opening with a diameter which is about from 20 to 80% of the diameter of the workpiece; and
a lower rotor engageable to the upper rotor to form a workpiece processing chamber.

59. The processor of claim 58 further comprising an upper fluid applicator extending into the through opening in the upper rotor, to provide a processing fluid to an upper surface of a workpiece in the processing chamber.

60. The processor of claim 59 comprising an actuator for moving the upper fluid applicator within the through opening for distributing a processing fluid to different portions of the workpiece.

61. The processor of claim 59 wherein the upper fluid applicator comprises a nozzle having a collection section for collecting processing fluid when fluid delivery to the upper nozzle is discontinued so that excess processing fluid does not drip from the upper nozzle into the processing chamber.

62. The processor of claim 58 further comprising a lower fluid applicator extending through the lower rotor for introducing a processing fluid to a lower surface of a workpiece in the processing chamber.

63. The processor of claim 58 further comprising a spin motor linked to the lower rotor.

64. The processor of claim 58 further comprising magnet means for engaging the upper and lower rotors.

65. The processor of claim 58 further comprising a sump at a central area of the lower rotor.

66. The processor of claim 58 further comprising a moveable drain assembly including a plurality of drain paths, with each drain path separately alignable with the processing chamber by vertically moving the drain assembly.

67. A workpiece processor, comprising:
an upper rotor;
a lower rotor engageable with the upper rotor to form a workpiece processing chamber; and a moveable drain assembly including a plurality of separate drain paths, with each drain path separately alignable with the processing chamber by moving the drain mechanism to align a single drain path with the processing chamber.

68. The processor of claim 67 wherein the lower rotor is at a fixed vertical position, and the drain assembly is moveable vertically, relative to the lower rotor.

69. The system of claim 67 wherein the upper rotor has a central through opening for air flow having a diameter of 20–80% of the diameter of the workpiece.

70. A workpiece processor, comprising:

an upper rotor having a first magnetic element;

a lower rotor having a second magnetic element, with the upper rotor engageable to the lower rotor via interaction of the magnetic elements, to form a workpiece processing chamber.

71. The processor of claim 70 with the processing chamber adapted for processing a workpiece having a specific diameter, and with the upper rotor having a through opening with a diameter which is 20–80% of the diameter of the workpiece.

72. The processor of claim 70 further comprising an upper fluid applicator extending into the through opening in the upper rotor, to provide a processing fluid to an upper surface of the workpiece.

73. The processor of claim 70 further comprising an actuator for moving the upper fluid applicator within the through opening for distributing a processing fluid to different portions of the workpiece, and for moving the upper fluid applicator out of the processing chamber.

74. The processor of claim 70 further comprising a lower fluid applicator extending through the lower rotor for introducing a processing fluid to a lower surface of a workpiece.

75. The processor of claim 70 further comprising a moveable drain assembly including a plurality of drain paths, with each drain path separately alignable with the processing chamber by vertically moving the drain assembly.

76. A workpiece processor, comprising:

a first rotor;

a second rotor; and engagement means for engaging the first rotor to the second rotor, without the need for physical contact with the first rotor.

77. The processor of claim 76 wherein the engagement means comprises elements for creating magnetic repulsion or attraction between the first and second rotors.

78. The processor of claim 76 further comprising drain means for separately draining fluids from the processing chamber.

79. A workpiece processor, comprising:

an upper rotor;

a lower rotor engageable with the upper rotor to form a processing chamber;

an opening in the lower rotor; and a snorkel having a first end vertically above the upper rotor, and having a second end leading to the opening in the lower rotor.

80. The processor of claim 79 further comprising a nozzle arranged to spray a process liquid through the opening in the lower rotor and onto a lower surface of a workpiece in the processing chamber, a tube connecting to the nozzle and to the second end of the snorkel, and a valve associated with the snorkel or the tube.

81. A workpiece processor, comprising:

an upper rotor;

a lower rotor engageable with the upper rotor;

a sump section on the lower rotor; and a nozzle extending up at least partially through the sump section.

82. The processor of claim 81 wherein the sump section comprises a conical depression around the center of the lower rotor.

* * * * *